(12) United States Patent
Francois

(10) Patent No.: US 7,279,061 B2
(45) Date of Patent: Oct. 9, 2007

(54) PROCESS FOR THE PRODUCTION OF IMPROVED METALLIZED FILMS

(75) Inventor: Jean-Marc Francois, Longuyon (FR)

(73) Assignee: ExxonMobil Oil Corporation, Irving, TX (US)

( * ) Notice: Subject to any disclaimer, the term of this patent is extended or adjusted under 35 U.S.C. 154(b) by 109 days.

(21) Appl. No.: 10/818,801

(22) Filed: Apr. 6, 2004
(Under 37 CFR 1.47)

(65) Prior Publication Data
US 2005/0028923 A1    Feb. 10, 2005

Related U.S. Application Data

(60) Provisional application No. 60/461,766, filed on Apr. 10, 2003, provisional application No. 60/461,737, filed on Apr. 10, 2003.

(51) Int. Cl.
*B32B 37/00* (2006.01)

(52) U.S. Cl. .................. 156/237; 156/238; 156/277; 53/396

(58) Field of Classification Search .......... 156/230, 156/233, 235, 237, 238, 247, 289, 277; 53/396
See application file for complete search history.

(56) References Cited

U.S. PATENT DOCUMENTS

| | | | |
|---|---|---|---|
| 3,660,190 A | 5/1972 | Stroszynski | |
| 3,753,769 A | 8/1973 | Steiner | |
| 4,215,170 A | 7/1980 | Vilaprinyo Oliva | |
| 4,344,998 A | 8/1982 | De Leeuw et al. | |
| 4,479,995 A * | 10/1984 | Suzuki et al. | 428/203 |
| 4,749,616 A | 6/1988 | Liu et al. | |
| 4,944,990 A | 7/1990 | Liu et al. | |
| 5,419,960 A | 5/1995 | Touhsaent | |
| 5,676,787 A * | 10/1997 | Rusincovitch et al. | 156/277 |
| 6,013,353 A | 1/2000 | Touhsaent | |
| 6,732,780 B1 * | 5/2004 | Gayoso | 156/540 |

FOREIGN PATENT DOCUMENTS

| | | |
|---|---|---|
| EP | 154 428 | 8/1990 |
| EP | 384 041 | 6/1994 |
| EP | 1 002 640 | 5/2004 |
| GB | 1566925 | 5/1980 |

\* cited by examiner

*Primary Examiner*—James Sells
(74) *Attorney, Agent, or Firm*—Darryl M. Tyus

(57) ABSTRACT

Improved metallized films are produced by transferring a protective layer onto a metal layer from the side of the film remote from the metal layer. The transfer preferably takes place in the metallizer shortly after metallization and before the metal layer is exposed to the atmosphere which reduces the tendency of the metal to oxidize leading to a purer metal layer with enhanced barrier properties.

31 Claims, 2 Drawing Sheets

Fig. 3

| Coating 2 |
| --- |
| Precoat 2 |
| Base film BOPP |
| Precoat 1 |
| Coating 1 |
| ALUMINIUM LAYER |

Fig. 4

| Precoat 2 |
| --- |
| Base film BOPP |
| Precoat 1 |
| Coating 1 |
| ALUMINIUM LAYER |
| Coating 2 |

Fig. 5

| Acrylic |
| --- |
| Precoat |
| Base film BOPP |
| Precoat |
| ALUMINIUM LAYER |
| Ctg2 |

Fig. 6

| Ctg2 |
| --- |
| Acrylic |
| Precoat |
| Base film BOPP |
| Precoat |

Fig. 7

| Ctg2 |
| --- |
| Acrylic |
| Precoat |
| Base film BOPP |
| Precoat |
| ALUMINIUM LAYER |

Fig. 8

| Skin |
| --- |
| Tie layer |
| Base film BOPP |
| Tie layer |
| Skin |
| ALUMINIUM LAYER |
| Adhesive layer |
| BOPP |

Fig. 9

| Tie layer |
| --- |
| Base film BOPP |
| Tie layer |
| Skin |
| ALUMINIUM LAYER |
| Peeled skin |

PROCESS FOR THE PRODUCTION OF IMPROVED METALLIZED FILMS

CROSS REFERENCE TO RELATED APPLICAITON

This application claims benefit to U.S. Provisional application 60/461,766 filed on Apr. 10, 2003, and benefit to related U.S. Provisional application 60/461,737 filed on Apr. 10, 2003.

FIELD OF THE INVENTION

This invention relates to the production of polymeric film structures, for instance, metallized barrier-type, oriented, polymeric films, which are especially, but not exclusively, useful for packaging of materials or labelling of articles, particularly articles benefiting from a reduced transmission of oxygen and/or water vapour or films requiring enhanced metallic appearance or special printing needs.

BACKGROUND OF THE INVENTION

It is well known to package materials in laminar or sheet-like plastic films or multi-layer plastic film laminates. Where the materials are sensitive to oxygen and/or water vapour (e.g., materials such as certain foodstuffs, beverages, chemicals, pharmaceuticals, seeds, electrical components, etc.), a plastic packaging material is chosen which will provide a barrier against ingress of oxygen and/or water vapour, or other gases. It is also well known to package certain foodstuffs in an atmosphere of gas contained within a plastic material chosen for its low permeability to that gas (controlled atmosphere packaging or modified atmosphere packaging sometimes known as MAP).

It is also known to apply a gas-barrier layer, for instance a thin layer of a metal such as aluminum, in order to improve the barrier of the film to oxygen, and other gases and/or to water vapour. Metallized films can be further laminated to a heat sealable film such as a polyolefin film (e.g., polyethylene or polypropylene) or they can be laminated to a polyester film, to produce a material suitable for packaging oxygen—or moisture-sensitive products. However, the gas and moisture barrier properties are not significantly improved by this lamination. It is also known to apply gas barrier layers, such as layers of ethylene vinyl alcohol copolymers or layers of polyvinylidene chloride.

For some applications it is desirable to decorate the package with, for example, print, and for reasons of security and integrity the printed material is frequently sandwiched between layers of the laminate. This can be achieved by printing the film, and metallizing over the print before further conversion. These activities are typically performed by film converters who process films for supply to the ultimate users. This procedure has the undesirable effect that the printed film becomes more permeable to oxygen and water vapour than the unprinted metallized film.

Metallized films are known to have low permeability to moisture but they have an undesirably high permeability to oxygen. Examples of such films include metallized polyolefin films, such as metallized mono-oriented or bi-axially oriented polypropylene film (hereafter OPP), metallized polyethylene film (hereafter PE), or metallized oriented polyester film (hereafter PET). Single webs of these films typically provide a moisture barrier of about 1 g/m$^2$/24 hours (at 38° C., 90% Relative Humidity). Laminates of such metallized polyolefin films to unmetallized films, suitable for packaging of moisture-sensitive materials, are described in GB patent 1,566,925. However, gas and moisture barriers are not significantly improved by this lamination when compared with those of the single web metallized film. The clear web itself or the adhesive used for the lamination can, however, be chosen to impart good barrier properties.

In some applications it is desirable to decorate the package made from laminates of metallized and unmetallized films with, for example, print, and the print is often sandwiched between the layers of the laminate. This is normally achieved by printing the clear web and laminating it to the metallized polyolefin web. Gas and moisture barrier properties are not significantly improved over that of the single web metallized film unless the clear web itself or the ink or the adhesive has good barrier properties. The decorated package could also be produced by printing the clear polyolefin web and metallizing over the print, and then laminating to another clear polyolefin web, but this is not used commercially, the former process described above being preferred. By laminating a metallized polyolefin film to a further web of a metallized polyolefin film, further reductions in permeability can be achieved and a material with both good moisture barrier and good oxygen barrier is produced. European patent 154 428 A describes such laminates. The terms "coating" and "precoating" as used herein include the presence of laminar sheet elements in the film structure as well as coatings applied as liquids, melts or solid granular additives. For example, an intermediate or external layer may be considered as a coating or precoating depending upon its use. Similarly the terms "coating" and "precoating" may also include tie layers or skin layers depending upon their intended use.

Polypropylene films with a coating on one or both sides and metallized on one of the coated surfaces are also known from, for example, U.S. Pat. No. 6,013,353, these films are commercially available. When the coating is of a thermoplastic polymer resin that has no particular barrier properties, such as an acrylic resin, oxygen permeability of the unmetallized coated film is undesirably high (typically 500-1000 cc/m$^2$/24 hours at 23° C. and 0% Relative Humidity) and oxygen permeability after metallization is also correspondingly high (greater than 10 cc/m$^2$/24 hours at 23° C. and 0% Relative Humidity). When the coating is of a thermoplastic polymer resin with good barrier properties, such as a polyvinylidene chloride resin, oxygen permeability of the coated film is significantly reduced (typically 25 cc/m$^2$/24 hours at 23° C. and 0% Relative Humidity) and oxygen permeability after metallization is correspondingly low (typically less than 5 cc/m$^2$/24 hours at 23° C. and 0% Relative Humidity). Such films are widely used for packaging either in single web form or laminated to another unmetallized web. For applications where it is desirable to decorate the package with, for example, print, and to sandwich said print within a laminate, the unmetallized web is normally printed and then laminated to the metallized coated polypropylene web.

Current metallized films suffer from the disadvantages that scratches and folds in the metal, typically aluminum, layer can significantly decrease the water vapour barrier and gas barrier properties of the metallized films. Furthermore, the aluminum layer is difficult to print, and needs to be primed before printing, and, in addition, the aluminum layer is not sealable. A further disadvantage is that the unprotected aluminum layer is very sensitive to scratching and oxidation which is detrimental to the optical quality and barrier properties of the film and for most applications the aluminum layer has to be protected by the converters with a varnish. U.S. Pat. No. 6,013,353 describes a process in which a coating is applied on top of the metal layer of a metallized film. The films of U.S. Pat. No. 6,013,353 are however described as having only moderate oxygen barrier properties.

It is known that thin aluminum layers such as those present in metallized films oxidize to some degree upon exposure to the atmosphere to produce aluminum oxide. It is also known that the presence of aluminum oxide in the aluminum layer is undesirable in that it is hygroscopic and reduces the barrier properties of the layer, thereby reducing barrier properties to both oxygen and water vapour. Accordingly in a process such as that described in U.S. Pat. No. 6,013,353 there can be significant oxidation of the aluminum layer.

SUMMARY OF THE INVENTION

We have now found that it is possible to apply a gas-barrier layer onto the first side of a first layer which carries a protective layer on the second side of the first layer, and to transfer the protective layer onto the gas-barrier layer.

The protective layer may be used to provide one or more desirable properties to the film. For example, the protective layer may provide easier sealability and/or printability, alternatively, the protective layer may provide improved barrier against water and/or gases, improved printability, improved resistance to scratches, and improved optical properties. For a structure in which the gas-barrier layer is a metal layer such as an aluminum layer, the presence of the protective layer reduces the exposure of the metal layer to oxygen.

The techniques of the present invention also simplify the manufacture of multi-layer films and can allow some of the current laminates of two or more films to be replaced by a monofilm or by a laminate having fewer layers but equivalent or better properties. The techniques according to this invention also allow films of comparable barrier properties to be produced with fewer layers and fewer manufacturing steps. Accordingly, manufacture is simplified and the associated costs reduced.

In one embodiment, the invention can provide a process for the production of a multi-layer film in which the gas-barrier layer is an aluminum layer in which the aluminum layer is protected by the protective layer before it contacts atmospheric oxygen. In such embodiment, the aluminum layer can undergo less oxidation than the degree of oxidation that takes place in the standard manufacture of metallized film. This reduced oxidation of the aluminum layer can result in an aluminum layer of higher purity which can provide better barrier properties for a given amount of aluminum deposited.

DETAILED DESCRIPTION OF THE DRAWINGS

FIG. 3 illustrates an intermediate film product according to this invention that has been metallized.

FIG. 4 illustrates a multilayer film produced according to this invention, wherein the transfer layer is shown having been transferred from the initial side of the first layer and attached with the metal layer on the second side of the first layer. In this embodiment, the transfer layer is a coating layer, as opposed to a coextruded or laminated layer.

FIG. 5 illustrates a multilayer film embodiment according to this invention wherein the metal layer is applied on the first layer, and having the transfer layer previously transferred.

FIG. 6 illustrates an initial film, before metallization, as may be used in the production of the multilayer film illustrated in FIG. 5.

FIG. 7 illustrates an intermediate film substrate that may be the film of FIG. 6 after application of a metal layer.

FIG. 8 illustrates a prior art laminated film as may have been prepared by prior art techniques.

FIG. 9 illustrates a film prepared according to this invention that may provide benefits equal to or superior to the performance of the film of FIG. 8.

DETAILED DESCRIPTION OF THE INVENTION

Figures 1, 2:
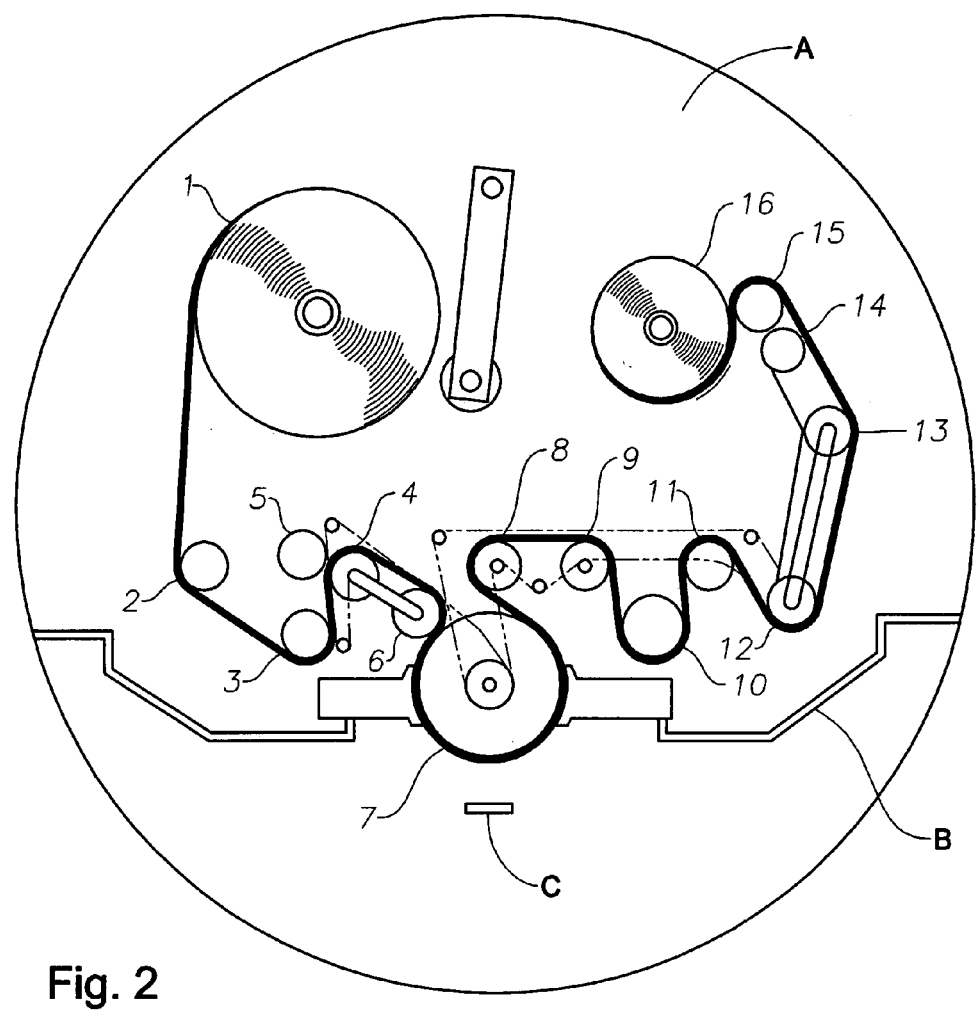
FIG. 1 illustrates a coated preliminary or initial film useful in preparing a multilayer film product according to this invention, wherein "Coating 2" may be considered a "transfer layer" as described below.
FIG. 2 illustrates a metallizer as may be typically used to apply a metal layer to the initial film, to produce an intermediate film substrate that is useful in preparing a multilayer film product according to this invention.

Applicant's related application, filed contemporaneously with this application as Applicant's file number 2002B098, on the process of making a film according to this invention is incorporated herein by reference.

The present invention therefore provides a process for the production of a metallized multi-layer film comprising providing a first layer or layers, comprising on one side, say its second side, a protective or "transfer" layer that is transferable to the other side of the first layer by the process described herein. The first or other side of the first layer supports a metal layer thereon, and the process comprising transferring the transfer protective layer to the side of the metal layer that is opposite to the side of the metal layer facing the first layer. The transferred layer is preferably a heat sealable layer, a barrier layer, and/or printable layer. As used herein, the term "barrier layer" is to be interpreted broadly to include layers used to reduce water, odor and or gas transmissibility properties of the film and also includes skin layers provided to improve film appearance, strength, structural integrity, and/or processiblity/machinability.

The process of the present invention provides a simple process for the production of a final film structure having reduced water-vapour transmission and/or reduced gas transmission properties comprising:

a) A metal layer;

b) A core or first layer having first and second sides, with one side contacting said metal layer, the core or first layer comprising one or more layers; and c) A transfer layer contacting the side of said metal layer opposite to said first layer.

The process comprises the steps of:

i) providing a preliminary film structure comprising a first layer and a transfer layer, each layer having a first side and a second side, the transfer layer detachably attached on the second side of the first layer;

ii) thereafter providing a metal layer having a first side and a second side and fixedly attaching the second side of the metal layer on the first side of the first layer to form an intermediate film structure;

iii) contacting the first side of the metal layer with the second side of the transfer layer to bond the first side of the metal layer with the second side of the transfer layer; and iv) thereafter detaching the first side of the transfer layer from the second side of the first layer and transferring the transfer layer from the second side of the first layer to the first side of the metal layer.

The polymer(s) of the core or first layer(s) generally has mechanical properties considered necessary or desirable in the film and is preferably an oriented polymer layer(s). In many cases, the first layer comprises a polymer that is a polyolefin having a melting point, for example, of at least about 125° C. and up to, for example, about 190° C., and a relatively high degree of crystallinity. A particularly desirable polyolefin making up the first layer comprise polypropylene and in many applications it is more desirable the polymer comprise an isotactic polypropylene homopolymer which is, for example, about 93% to 99% isotactic and has a crystallinity of about 70% to 80%, and a melting point, for example, of about 145° C. or higher, e.g., up to about 167° C., this is particularly useful in the production of an oriented first layer. In some embodiments, the first layer comprises multiple layers, including homo, co or ter polymers comprising polypropylene, polyethylene, and butylene.

Another desirable polymer suitable for the first layer is a high density polyethylene (HDPE), which is a substantially linear polymer having a density, for example, of from about 0.952 to 0.962 g/cm$^3$, a melting point of, for example, from about 130° C. to 148° C. and a degree of crystallinity as measured by differential scanning calorimetry of at least 2%, preferably at least 15%. HDPE is also particularly useful in the production of an oriented first layer. Examples of polymers which may be used to produce unoriented first layers include polyolefins such as polymers and copolymers of ethylene and propylene, polyamides and polyester whose films can be produced by casting and polyvinyl chloride films, generally produced by calendaring.

If it is desired to produce a film which is opaque after being subjected to uniaxial or biaxial orientation as described hereinafter, opacifying particles or voiding agents, such as calcium carbonate or polybutylene terephthalate, may, optionally, be dispersed in the polymer of the one or more layers of the first layer before extrusion and orientation of the film. As used herein, the term voiding agents is defined broadly to include all organic and inorganic particulate materials known and used in the films industry for voiding. The particle size of the voiding agents may be, for example, about 0.1 to 10 microns, preferably about 0.75 to 2 microns in mean diameter. The voiding agents may be present in the first layer in an amount of up to about 20 wt. %, preferably about 6 wt. % to 12 wt. % based on the total weight of the first layer. To preserve the structural integrity of the void-containing first layer, a thin layer of the polymer from which the first layer is derived, but without voiding agents may be co-extruded on one or both sides of the void-containing first layer. In this case, the total of the void-containing polymer first layer and the non-void-containing polymer layers may be considered the overall first layer of the film. When the first polymer layer is subjected to uniaxial or biaxial orientation, a cavity or void forms around each voiding particle giving the oriented film an opaque appearance.

An adjacent skin layer having a greater adhesiveness to other materials than the first oriented layer may, optionally, be provided on one or both sides of the first layer. The polymer of the optional skin layer adjacent to one or both surfaces of the first layer is preferably an extrudable hydrocarbon polymer such as a polyolefin having a lower melting point, e.g., at least about 5° C. lower and up to about 50° C. lower, than the melting point of the polymer of the first layer. Polymers falling within this category when the polymer of the first layer is an isotactic polypropylene homopolymer are, for example, isotactic copolymers of propylene and a minor amount, e.g., about 1 wt. % to 10 wt. %, of one or more different 1-olefins, e.g., ethylene or a higher 1-olefin having, for example, 4 to about 8 carbon atoms. Particularly suitable are isotactic copolymers of monomers consisting of propylene, ethylene in an amount of, for example, 1 wt. % to 5 wt. % of the copolymer, and, optionally, butene in an amount, for example, of about 0.5 wt. % to 10 wt. %, typically 0.5 wt. % to 5 wt. % of the copolymer. Other polymers which can be used for the skin layers of the film substrate when the polymer of the first layer is an isotactic polypropylene homopolymer are, for example, high density polyethylene (HDPE), and linear low density polyethylene (LLDPE). If the polymer of the first layer is an HDPE, the polymer of the skin layers adjacent to the first layer may be any of the polymers disclosed previously as suitable for such layers when the first layer polymer is an isotactic polypropylene homopolymer except for HDPE itself, as long as the polymer has the requisite lower melting point than the HDPE making up the first layer. In this connection, it should be noted that the polymers of the skin layers may be the same or different. For example, when the polymer of the first layer is a polypropylene homopolymer, the skin layer polymer may be a terpolymer of propylene, ethylene and butene on one surface of the first layer and HDPE on the other surface.

In one embodiment, the substrate of the core or first layer of the film used in the process of this invention comprises a first layer and optionally, one or two adjacent skin layers having a lower melting temperature than the first layer. The polymer substrate is preferably prepared by co-extruding the layers. After such extrusion, utilizing conventional extrusion techniques, the film can be reheated and molecularly oriented in the longitudinal, i.e., machine, direction and, optionally, in the transverse direction. This uniaxial or biaxial orientation, which greatly improves the stiffness and tensile strength properties of the film, is accomplished by utilizing conventional techniques to stretch sequentially the film, for example, about three to eight times in the machine direction and, optionally, five to twelve times in the transverse direction, at a drawing temperature of about 100° C. to 200° C. Alternatively, stretching may be simultaneous in the machine and transverse directions such as in blown tubular film production or by Linear Motor Simultaneous Stretching. In some cases, a co-extruded film having a first layer of polypropylene homopolymer would be biaxially oriented, while a film having a first layer of LDPE may be substantially uniaxially oriented, i.e., primarily only in the machine direction, with relatively little to no transverse stretching.

The film utilized in the initial and intermediate stages and the final film product manufactured according to the process of this invention may also comprise a second layer, such as an additional barrier layer, on the side of the core layer supporting the metal layer, wherein the second layer is positioned between the core layer and the metal layer. The second layer may comprise one or more layers. Such optional layer may be coextruded with the core/first layer or combined with the first and second layer, such as by extrusion lamination. In some instances the second layers may be utilized to improve the adhesion between layers. The second or similar layers may also be positioned on the other side of the core layer between the core/first layer and the transfer layer in an initial or intermediate film embodiment having the transfer layer on the second side of the core layer.

The metal layer is positioned on the first side of the core layer and is preferably an aluminum layer. The metal layer is preferably a continuous layer. The other layers can be applied with 100% surface coverage or less than 100% coverage, with a regular or irregular shape; 100% coverage is preferred. In a preferred embodiment the metal layer is an aluminum layer applied on the surface of a film under reduced pressure or vacuum deposition process.

Before applying the metal, a primer or polymeric, film-forming coating, optionally may be applied to the surface intended to receive the metal coating. In addition to the metal receiving layer being treated, other layers may also be treated where it is beneficial to improve layer bonding. The surfaces may be treated to ensure that the layers will strongly adhere to the film substrate, thereby eliminating the possibility of the layers peeling or being stripped from the film, except where it is intended that one layer be transferred from one side of the film to the other. Such treatments to improve layer adhesiveness can be accomplished by employing known prior art techniques, for example, film chlorination, i.e., exposure of the film to gaseous chlorine, treatment with oxidizing agents, such as chromic acid, hot air or steam treatment, flame treatment, corona discharge treatment, and the like. In many embodiments, flame, plasma, or corona discharge treatment of the surfaces is preferred in the production of the films of this invention.

In addition, films according to this invention further comprise a transferable or transfer layer. In a final film product embodiment, as produced by the process according to this invention, the transfer layer is positioned on the first side of the first layer and a metal layer positioned between the transfer layer and the core/first layer. The transfer layer is discussed in more detail later in this specification but generally, the transfer layer is formed substantially with the first and other layers, such as by co-extrusion, or subsequent to extrusion of the first layer, such as by lamination. Such pre-metallized substrate structure may be referred to as a preliminary or initial film structure, as related to films of this invention. Such initial film structure is then metallized on the first side of the core layer, opposite the transfer layer side of the core layer. Such metallization produces what maybe referred to as an intermediate film structure.

After application of the metal layer, the transfer layer is transferred during a post-metallization winding and unwinding process, from the side of the first layer that the transfer layer is initially provided on, to the other side of the first layer, on the outer surface of the metal layer opposite the first layer. The transfer layer then functions to protect the metal layer from significant exposure to oxygen or atmosphere degradation during later post-transfer conversions, winding and unwinding. Another benefit of this process is that such protection is obtained substantially prior to any significant exposure of the metal layer to oxygen and obviates the need to perform a separate post-metallization coating step by a converter. This whole process is discussed in more detail below.

Referring to application of the metal layer to the preliminary structure, metallization may take place in a conventional metallizer, which consists of a chamber divided into two sections, both of which are atmosphere evacuated to a reduced pressure less than atmospheric pressure. A reel or roll of unmetallized film comprising the first layer and optionally, the second layer and/or the other optional layers, such as the skin layer(s) is located in one of the two sections. The film to be metallized passes from the reel onto a roll which carries the film into the other section of the metallizer where metal, such as aluminum, is vaporized and deposited onto a surface of the film, such as a surface of the second layer, usually as the film passes around the roll. Typically the roll is cooled to between −15° C. and −35° C. After metallization the metallized film passes back into the first section of the metallizer where the metallized film is wound into a roll or reel.

The thickness of the metal layer that is deposited in the metallizer should preferably be such that at its minimum thickness it provides a substantially continuous layer and at its maximum thickness it has adequate adhesion to the substrate. Thickness of the relatively thin vacuum-deposited layers of metal is normally, and most conveniently, quoted in terms of their light transmission or optical density. For a gas-barrier layer made of aluminum, an optical density in the range 1.0-4.0 may be preferred with the range 1.8-3.5 being frequently preferred. The optical density is measured by using a Gretag Macbeth D200-II machine, which directs a beam of light from a halogen lamp perpendicularly onto the film and measures the percentage of light that is transmitted by the film. Any metal, which on vacuum deposition provides a barrier layer may be used, with aluminum being typically preferred. When the gas-barrier layer is an aluminum layer, the thickness may be preferably between 5 and 500 nanometers.

In general, an uncoated and surface treated film substrate produced by co-extrusion and orientation may, optionally, comprise skin layers or second polymeric barrier layers that has a thickness, for example, of about 0.5 to 3.0 mils. Typically, where the first layer is provided with skin layers, the first layer has a thickness, for example, of about 80% to 99% of the total thickness of the first layer and the one or two adjacent skin layers each has a thickness of, for example, about 1% to 10% of the total thickness. If two skin layers are present, their thickness' may be the same or different. Application of a metal layer to a treated surface is usually accomplished by conventional vacuum deposition although other methods known in the art, such as electroplating or sputtering, foil embossing, or lamination may also be used. Aluminum is preferred as the metal utilized for this purpose although other metals similarly capable of being deposited, such as gold, zinc, copper, silver and others known in the art may also be utilized for certain purposes.

After metallization, the transfer layer is transferred from the non-metallized side of the first layer to the outer side of the metal layer, that is, on the side of the metal layer opposite from the first layer. The metal layer comprises a first side and a second side, the second side of the metal layer being positioned on but not necessarily immediately adjacent, the first side of the second layer or the first side of the first layer. In the final multilayer film product, the transfer layer comprises a debonded surface, which may typically be the exterior surface, and a metal-bonding surface, the metal bonding surface fixedly engaged on the first side of the metal layer, typically directly engaged with the metal layer. Preferably, the transfer layer has polar properties that enhance bonding between the transfer layer and the metal layer. The de-bonded surface comprises optical and aesthetic qualities suitable or desirable for the desired application for use of the final multilayer film product. The appearance or optical performance of the debonded surface of the transfer layer is broadly adjustable depending upon the type of layer that the transfer layer is, e.g., seal layer, print layer, or barrier layer. The mix or composition of materials and/or additives provided within the transfer layer will dictate the features and performance of the debonded surface, the metal bonding layer and of the transfer layer on whole.

In the initial/preliminary, pre-metallization film structure, the transfer layer was formed or applied subsequent to extrusion, on the second side of the first layer, wherein the de-bonded/detached surface of the transfer layer was removably bonded/attached on the second side of the first layer. After metallization, the transfer layer was transferred to and fixedly engaged on the first side of the metal layer opposite to the second layer upon winding the film on a roll after the metal layer is applied to the second layer. The transfer layer generally comprises at least one of a heat sealable layer, a barrier layer and/or a printable layer. The debonded/detached surface of the transfer layer thereafter typically comprises an exterior surface of the film and is also at least one of printable, sealable, and optionally may be laminated with another polymeric substrate. As stated previously, the appearance and/or performance of the debonded surface may be tailored by one skilled in the art, using techniques and additives known in the art to provide a desired optical performance, appearance, or functional effect such as sealability gloss, matte, opacity, barrier properties, etc. What is important is that the transfer layer is capable of removably or detachably bonding in the initial or intermediate film structures, on the second side of the first layer, and can thereafter, after metallization and post-metallization rewinding, fixedly bond with the metal layer or on an exterior side of the metal layer to thereafter detach or de-bond from the second side of the first layer when the metallized, rolled multilayer film is unwound, thus facilitating transfer of the transfer layer and formation of the final film product.

The heat sealable and/or printable layer can be made with a polymer material, water-based, solvent-based or solventless thermoplastic lacquers, or inks based on resins. It may be preferred the transfer layer contain or consist of a polymer containing polar groups which have an affinity for the metal layer. Examples of preferred materials include copolymers of ethylene and unsaturated esters such as vinyl esters, for example, vinyl acetate or vinyl propionate and acrylic esters, such as methyl acrylate, ethyl serylate or butyl acrylate. Copolymers of ethylene and unsaturated alcohols such as vinyl alcohol may also be used. However, it may be preferred that the layer contain carboxylic acid groups and copolymers of ethylene and acrylic acid and/or methacrylic acid. A preferred heat sealable layer comprises a low temperature sealable coating which can be applied to the metallized surface of the film without a primer, a preferred such coating comprises a base copolymer of about 10 wt. % to 35 wt. % of an alpha, beta-ethylenically unsaturated carboxylic acid, with about 65 wt. % to 90 wt. % of ethylene, or an alkyl acrylate or methacrylate, acrylonitrile, or mixtures thereof. The latter unsaturated acid may be, for example, acrylic acid, methacrylic acid, maleic acid, crotonic acid, itaconic acid, citraconic acid, or mixtures thereof. Preferably, the copolymer is of about 65 wt. % to 90 wt. %, more preferably about 75 wt. % to 85 wt. % of ethylene, and about 10 wt. % to 35 wt. %, preferably about 15 wt. % to 25 wt % of acrylic acid (an EAA copolymer) or methacrylic acid (an EMA copolymner). The copolymer, preferably, has a number average molecular weight (Mn) of, for example, about 2,000 to 50,000, preferably about 4,000 to 10,000.

The second protective layer may be a transfer layer. In this embodiment, the transfer layer can be made with water-based, solvent-based or solventless thermoplastic lacquers, or inks based on resins. It may be preferred that the transfer layer comprise a polymer containing polar groups which have an affinity for the metal layer to facilitate transfer. Examples of preferred materials include copolymers of ethylene and unsaturated esters, such as vinyl esters, for example, vinyl acetate or vinyl propionate and acrylic esters, such as methyl acrylate, ethyl acrylate or butyl acrylate. Copolymers of ethylene and unsaturated alcohols, such as vinyl alcohol, may also be used. However, it may be preferred that the copolymer in the layer contains carboxylic acid groups and copolymers of ethylene and acrylic acid and/or methacrylic acid. A preferred heat sealable layer that may be used as the second protective layer comprises a low temperature sealable coating which can be applied to the metallized surface of the film without a primer, a preferred such coating comprises a base copolymer of about 10 wt. % to 35 wt. % of an alpha, beta-ethylenically unsaturated carboxylic acid, with about 65 wt. % to 90 wt. % of ethylene, an alkyl acrylate or methacrylate, acrylonitrile, or mixtures thereof. The latter unsaturated acid may be, for example, acrylic acid, methacrylic acid, maleic acid, crotonic acid, itaconic acid, citraconic acid, or mixtures thereof. Preferably, the copolymer is of about 65 wt. % to 90 wt. %, more preferably about 75 wt. % to 85 wt. % of ethylene, and about 10 wt. % to 35 wt. %, preferably about 15 wt. % to 25 wt. % of acrylic acid (an EAA copolymer) or methacrylic acid (an EMA copolymer). The copolymer, preferably, has a number average molecular weight (Mn) of, for example, about 2,000 to 50,000, preferably about 4,000 to 10,000.

When the carboxylic acid copolymer in the preferred low temperature sealable coating is used as the second protective layer, it is often obtained as a solution or fine dispersion of an ammonium salt of the copolymer in an ammoniacal water solution. When the copolymer is dried, ammonia is given off and the ionized and water sensitive carboxylate groups are converted to largely unionized and less water-sensitive free carboxyl groups. In another embodiment, however, there may be added to the solution or dispersion of the ethylene copolymer an amount of ions of at least one metal from Group Ia, IIa, or IIb of the Periodic Table, preferably, sodium, potassium, lithium, calcium or zinc ions, and most preferably sodium ions, e.g., in the form of their hydroxides. The quantity of such metallic ions may be in the range sufficient to neutralize, for example, about 2% to 80%, preferably about 10% to 50% of the total carboxylate groups in the copolymer. The presence of such metallic ions has been found in many cases to result in an improvement in certain properties, e.g., coefficient of friction (COF), hot tack, and blocking, without an unacceptable sacrifice of other properties, e.g., low minimum seal temperatures (MST).

When the base copolymer in the sealable coating, which is the second protective layer, is an EAA copolymer of ethylene and acrylic acid and the neutralizing metal ions are sodium ions added as sodium hydroxide, then the amount of sodium hydroxide added should correspond to the percentages of carboxylate groups to be neutralized, may be, for example, about 0.33 phr to 8.8 phr, preferably about 1.1 phr to 5.5 phr, where "phr" stands for parts by weight per hundred parts of the total resin, which is the same as the EAA copolymer when no other resin is present. For the purpose of determining the phr of various additives present in the coating, all the carboxylate groups of the ethylene copolymer should be assumed to be in their free carboxyl (—COOH) form.

When the second protective layer is the carboxylic acid-containing base copolymer, it may also contain a dispersed wax, e.g., a relatively large particle size carnauba or microcrystalline wax as an anti-blocking agent. Other waxes which may be used are, for example, natural waxes such as paraffin wax, beeswax, japan wax, montan wax, etc., and synthetic waxes such as hydrogenated castor oil, chlorinated hydrocarbon waxes, long chain fatty acid amides, etc. The wax may be present in the coating in an amount of, for example, about 2 phr to 12 phr, preferably about 3 phr to 5 phr.

In addition to functioning as an anti-blocking material, the wax, when incorporated into the coatings, functions to improve the "cold-slip" properties of the films coated therewith, i.e., the ability of a film to satisfactorily slide across surfaces at about room temperature.

The sealable coating when used as the second protective layer, may also contain a particulate material, e.g., an amorphous silica, for the purpose of further reducing the tack of the coating at room temperature. Amorphous silica is composed of particles which are agglomerations of smaller particles and which have an average particle size of, for example, about 2 to 9 microns, preferably about 3 to 5 microns, and may be present in the sealable coating in an amount, for example, of about 0.1 phr to 2.0 phr, preferably about 0.2 phr to 0.4 phr.

Other optional additives, which may be included in the sealable coating when used as the second protective layer, include other particulate materials such as talc, which may be present in an amount, for example, of about 0 phr to 2 phr, cross-linking agents such as melamine formaldehyde resins which may be present in an amount, for example, of 0 phr to 20 phr, and anti-static agents such as poly(oxyethylene) sorbitan monooleate which may be present in an amount, for example, of about 0phr to 6 phr. An anti-bacterial agent may also be present.

In addition to the second protective layer as previously described, a polymeric, film-forming coating may, optionally, be applied to the surface of the first layer opposite to the surface that carries the metal layer. To ensure adherence of such coating to such opposite surface of the first layer, a coating of primer may be first applied to such surface, either after the skin layer on such surface is treated to increase further its adhesiveness to other materials, e.g., by corona discharge, plasma or flame treating, or in the absence of such treatment. Primer materials which are suitable are well known in the art and include, for example, titanates, poly (ethylene imine), and reaction products of an epoxy resin and an aminoethylated vinyl polymer. The primer is applied to the treated surface of the film substrate by conventional solution coating means. A particularly effective primer is poly(ethylene imine) applied as either an aqueous or organic solvent, e.g., ethanol, solution, or as a solution in a mixture of water and organic solvent, containing about 0.5 wt. % of the imine.

The coating applied to the, optionally, primer-containing surface of the first layer opposite the metallized surface in addition to the second protective layer may also be a sealable coating. In this way a multi-layer film which is sealable at both surfaces may be produced. Alternatively, the coating may be any of other types of polymeric, film-forming coatings known in the art. A particularly suitable coating is one containing as a film-forming component an interpolymer of 1) about 1.8 wt. % to 80 wt. % of at least one $C_1$-$C_4$ alkyl methacrylate, 2) about 18 wt. % to 80 wt. % of at least one $C_1$-$C_4$ alkyl acrylate, and 3) about 1 wt. % to 15 wt. % of at least one alpha, beta-ethylenically unsaturated carboxylic acid based on the weight of the polymer (an "acrylic terpolymer"); and colloidal silica as a hot slip agent in an amount, for example of about 30 phr to 60 phr and having a particle size of, for example, about 10 to 200 nanometers. The unsaturated acid of the acrylic terpolymer may be any of those disclosed previously as suitable for the copolymer in the low temperature sealable coating applied to the metallized surface of the film, although acrylic and/or methacrylic acid are preferred. The copolymer may be utilized in the coating composition as a partially neutralized aqueous solution or as a dispersion, i.e., a latex. Additives may be present in the coating compositions which are the same or similar in nature and amount as those disclosed previously as suitable in the low temperature sealable coating applied to the metallized surface of the film, particularly a wax such as carnauba wax, which functions as an anti-blocking and cold slip agent, and talc, which acts as a lubricant. This type of composition is disclosed, for example, in U.S. Pat. Nos. 3,753,769 and 4,749,616.

Another type of polymeric coating which may be applied to the surface of the first layer opposite the metallized surface, in addition to the second protective layer is a coating in which the film-forming component is a polymer of at least about 50 wt. % of vinylidene chloride, preferably about 75 wt. % to 92 wt. % of vinylidene chloride, 2 wt. % to 6 wt. % of an alpha, beta-ethylenically unsaturated acid. These materials were disclosed previously as suitable monomers for the copolymers used in sealable coatings where they may be copolymerized with a $C_1$-$C_4$ alkyl acrylate or methacrylate, or acrylonitrile. Additives, the same or similar to those disclosed previously in other coatings may also be present in these coatings. The vinylidene chloride copolymer may be utilized as a partially neutralized aqueous solution or as an aqueous dispersion, i.e., a latex. This type of coating is disclosed, for example, in U.S. Pat. No. 4,944,990. This coating may be applied, optionally, in conjunction with a primer.

The various layers described herein and, if used, the primer and polymeric coatings can be applied in any suitable manner such as by gravure coating, roll coating, dipping, spraying, etc. Where an aqueous solution is used, any excess aqueous solution can be removed by squeeze rolls, doctor knives, etc. The coating compositions will ordinarily be applied in such an amount that there will be deposited following drying, a smooth, evenly distributed layer of from about 0.2 to about 1 g/1000 sq. in of film surface. In general, when the coating is a low temperature sealable coating, the thickness of the applied coating is such that it is sufficient to impart the desired sealability, coefficient of friction (COF), and hot slip characteristics to the substrate polymer film.

The coatings once applied and/or transferred are subsequently dried by hot air, radiant heat or by any other suitable means thereby providing a non water-soluble, adherent, glossy coated film product useful, for example, as a packaging film.

A printed ink pattern may be applied on either surface of the film, or to the uncoated surface opposite the metal layer if no coating is applied to such opposite surface, using, for example, a conventional solvent-based ink composition. The printed pattern may be covered with an over-lacquer to protect the pattern from damage. The over-lacquer may cover the entire surface containing the printed pattern, in which case sealing is accomplished solely by the softening of the coating or a polymer skin layer on the opposite surface of the film on the portion of the film constituting the outer film of the seal. However, if an "in to out" seal is also desired wherein sealing is also accomplished by the softening of the coating or polymer skin layer on the surface containing the printed ink pattern, a portion of which constitutes the inner film of the seal, then the printing and over-lacquering may be in a pattern to allow the coating or polymer skin layer to be exposed in the sealing region.

Optionally, another film (the "laminating film") may be laminated to a surface of the metallized film produced according to this invention. The other film will normally be laminated when an over-lacquer has not been applied, for the purpose of improving the mechanical properties, e.g., tear strength, and machinability, increasing the stiffness, protecting the printed pattern and/or providing hermetic seals of the metallized film. An over-lacquer may or may not be applied. The laminating film may be bonded to the sealable coating on either the metal layer surface or the opposite surface of the film produced according to this invention. The laminating film may be applied after a printed pattern has been applied to the sealable coating or in the absence of such printed pattern. The film may, for example, comprise a polymer having superior mechanical properties, e.g., isotactic polypropylene homopolymer, which is bonded to the film produced according to this invention, such as by an adhesive, molten polymer having a lower melting point than the laminating polymer, e.g., low density polyethylene (LDPE). Alternatively, the laminating film may comprise a major layer of such polymer of superior mechanical properties and a minor layer of a polymer having a lower melting temperature than the polymer of the major layer with the lamination being accomplished by pressing the surface of the laminating film containing such minor layer against the desired surface of the metallized film of the invention at a temperature high enough to render tacky the polymer of the minor layer. The methods and equipment necessary to accomplish the described bonding are well known in the art.

An actinic radiation or an ionizing radiation or a combination of actinic and ionizing radiation can be applied on the whole surface or only on selected areas of the film, for instance, in order to crosslink a layer or in order to surface treat to increase the anchorage at a particular interface between two layers.

When the protective layer is a printable and/or sealable layer it should be sealable on the side opposite the side adjacent the metal layer after transfer to the metal layer and may be printable on the side adjacent or opposite the metal layer. Accordingly, the surface of the protective layer that is exposed due to the transfer of the protective layer may also be printable and/or sealable so that the multi-layer films produced, according to the present invention, can be printable and/or sealable on both sides. This enables the films to be used on packaging machines without any additional work by the converters who have traditionally applied additional printable and/or sealable layers to produce the ultimate packaging material.

The films produced, according to the present invention, are particularly useful as packaging materials, and are especially, but not exclusively, useful for packaging of materials sensitive to oxygen and/or water vapour or for controlled or modified atmosphere packaging of foodstuffs. They can be used in many other applications, for instance, in labels, graphic art and in construction. Furthermore, in the films produced, according to the invention, the metal layer is sandwiched between two polymeric coatings having viscoelastic properties especially designed to avoid the formation of cracks in the metal layer when the film is folded. This avoids the loss of barrier properties due to such cracks.

Typical thickness' of the films and coating densities for oriented polypropylene films produced according to the present invention may be that the first oriented polypropylene layer is of thickness from 15 to 60 microns. Metal, particularly aluminum layers, may be from 5 to 500 nanometers thick. Any precoats that are used may be typically present at from 0.1 to 1 gram per square meter and coatings such as heat seal and/or printable coatings or barrier coatings are present at from 0.1 to 5 grams per square meter preferably 0.1 to 2 grams per square meter.

Films typically contain additives, but we prefer that the film contain a low level of migratory additives, such as slip additives in the surface to be metallized, since these additives will migrate to the surface, and although not substantially affecting barrier properties, could disrupt adhesion of the metal layer.

In a preferred process for the production of a multi-layer film according to this invention, the process comprises the steps of:
i) providing a preliminary film structure comprising a first layer and a transfer layer, each layer having a first side and a second side, the transfer layer detachably attached on the second side of the first layer;
ii) thereafter providing a metal layer having a first side and a second side and fixedly attaching the second side of the metal layer on the first side of the first layer to form an intermediate film structure;
iii) contacting the first side of the metal layer with the second side of the transfer layer to bond the first side of the metal layer with the second side of the transfer layer; and
iv) thereafter detaching the first side of the transfer layer from the second side of the first layer to transfer the transfer layer from the second side of the first layer to the first side of the metal layer.

The step of contacting, in step iii) above, may further comprise winding the intermediate film structure into a roll. Thereafter, the detaching may be performed by unwinding the produced multilayer film from the roll to transfer the transfer layer from the second side of the first layer to the first side of the metal layer.

The process of the present invention may be illustrated in relation to a three-step process. The first step comprises the production of a coated film having the structure of a polypropylene film (corona treatment on both sides), coated with a precoat and a topcoat on both sides as is illustrated in FIG. 1. Precoat 2 is of a compound that decreases the physicochemical interactions at the interface between the precoat 2 and the coating 2. Preferably, the precoat 2 comprises a compound that reacts with the corona-treated surface, but does not react strongly with the coating 2. On the other hand, the material of coating 1 is chosen so that coating 1 is well anchored onto precoat 1 and similarly the material of precoat 1 is chosen so that precoat 1 is well anchored onto the base polypropylene film.

In a preferred embodiment of the invention, a modified corona treatment may be used in order to have a better anchorage of the precoat(s) on the polypropylene film. In yet another embodiment, a compound having a high affinity for the aluminum may be added into the material used for coating 2.

Coating 2 of the film illustrated in FIG. 1 is preferably a standard low temperature sealing composition, such as those described in U.S. Pat. Nos. 5,419,960 and 6,013,353 and is hereafter referred to as Ctg2. Ctg2 is a 15 wt. % solid aqueous dispersion or solution of an ammonium salt of a copolymer of ethylene and acrylic acid, containing 1.5 phr (parts by weight per hundred parts of the dry copolymer) of sodium hydroxide (NaOH), together with fillers and antifoam.

The coated film is metallized on the surface of coating generally with aluminum. This may be accomplished by use of a standard metallizer, which may involve plasma or radiation treatment in the metallizer. The aim of the optional irradiation is to increase the physico-chemical interactions at one or several polymer/metal or polymer/polymer interface(s).

A typical metallizer is illustrated in FIG. 2, which shows the metallizer chamber (A) divided into two sections by barrier (B). The reel of unmetallized film (1) is mounted in the upper section of the metallizer and the film is fed by a series of guide rolls (2 to 6) to the process reel 7. The process reel bridges the two sections of the metallizer (both of which are under reduced pressure and are substantially oxygen free). The process reel 7 carries the film into the second section of the metallizer in which metal, usually aluminum, is deposited onto the film by vaporization of the metal by heating the aluminum wire (C) to around 1,200° C. The metal is deposited onto the film and a metal layer formed by virtue of the cold process reel 7, which is held at between −15° C. and −35° C. The metallized film then passes via a further series of rollers (8 to 15) to the winder reel 16. The film is wound on winder reel 16 so that after winding the metal layer lies against the coating layer 2 (See FIG. 1). The metallized film produced in the metallizer at process reel 7 from the film of FIG. 1 is shown in FIG. 3.

The third step in the process involves the transfer of Ctg2 onto the metal layer to form the structure shown in FIG. 4. The Ctg2 is in direct contact with the aluminum and with the precoat 2 and the physico-chemical interactions at the interface between Ctg2 and the surface of the aluminum layer are significantly higher than the physico-chemical interactions at the interface between Ctg2 and precoat 2. The Ctg2, therefore, becomes bonded to or fixedly engaged with the aluminum layer due to the forces which press the layers together during winding on the winder reel 16 and/or unwinding from the winder reel 16, such as during slitting. In order to control the transfer of Ctg2, the following parameters should be controlled: Physico-chemical interactions at all polymer/polymer and polymer/aluminum interfaces; the angle of winding and unwinding at the winder reel; the speed of winding and unwinding at the winder reel; the temperature of the film on the rewind roll 16; the visco-elastic properties of Ctg2, coating 1 and precoat 2; and the thickness of coating 1 and Ctg2. These properties should all be selected according to the properties of the various film elements and the desired final film parameters to ensure proper bonding and transfer of the transferable layer Ctg2. For many typical film embodiments we have found that the transfer of the transferable layer may be enhanced if the temperature of the process reel (7) is increased from the traditional range of −15° C. to −35° C. to a temperature in the range of 10° C. to 30° C. Alternatively, the temperature of the process reel in the metallizer may be maintained between −15° C. and −35° C. and the reel may be heated to between 10° C. to 30° C. after metallization but before unwinding, for instance, with an infrared heater.

Subsequent to winding of the metallized film onto the re-wind roll 16, as is illustrated in FIG. 3, facilitating the bonding of Ctg2 onto the adjacent metal layer, the film may be unwound from the re-wind roll. The unwound film will be structured with Ctg2 separated from precoat 2 and fixedly bonded with the metal layer as illustrated in FIG. 4. In this way the metallized layer is substantially, not directly, exposed to any atmospheric oxygen outside the confines of the metallizer chamber.

The process of the present invention may be used to produce a variety of structures and the structures are illustrated by a process that comprises applying two precoats onto a polypropylene film and then applying two top coatings on the precoats. The coated polypropylene film is then metallized on one side and the remote top coating then transferred onto the surface of the metal layer. The process is the same transfer-coating process as the one described previously, but with a turning device for film structure. For all the structures discussed, the thicknesses referred to are only indicative. The scope of the invention is not limited by the thickness or the drawings, which are merely illustrative of particular embodiments of this invention.

In a preferred embodiment, an ethylene vinyl alcohol copolymer is used as the precoat for the metal layer since it will enhance the barrier properties. The use of a metallizable coating, for instance, acrylic polymer based, should provide good barriers after metallization.

FIG. 5 shows a metallized film that is printable and sealable on both sides. The film is produced in the following three steps; base film orientation, one pass coating with inverted band followed by metallization, and transfer.

To produce the film illustrated in FIG. 5, a precoat layer of polyethylene imine is first applied to one side of an oriented polypropylene film and then dried. Using a first coating station, an acrylic coating is then applied to the precoated side of the film and then dried in an oven. The film is then inverted on a turning bar and, using a second coating station, Ctg2 is detachably applied on the top of the acrylic coating as illustrated on FIG. 6, and then dried. The film is then metallized on the side remote from the Ctg2 to produce the film shown in FIG. 7. After metallization, Ctg2 is transferred onto the aluminum, typically on the winding reel in the metallizer, to give the film of FIG. 5. The test on the pilot coater gave a peeling force (160° to 180° angle) for the transfer of Ctg2 of around 0.20 to 0.25N/25 mm at 300 mm/min. for a film based on an acrylic precoat overcoated with a Ctg2 coating, this was found to be repeatable on a larger scale. The metallizable precoat is optional; the metal can be deposited, for instance, directly onto a treated polyolefin film.

FIGS. 5 to 7, therefore, illustrate the production of a metallized film that is printable and/or sealable on both sides according to the present invention. The final film is printable and/or sealable on both sides since, initially, the film had two layers of sealable and/or printable material on the side remote from the metal layer and one of these layers has been transferred onto the metal layer on the opposite side of the film. The film can be manufactured on existing production lines using standard equipment for orientation, coating, and metallizing. When the film of FIG. 6 is wound in the reel, the detachable Ctg2 is in direct contact with the aluminum in the reel. During winding or unwinding of the reel, Ctg2 is transferred onto the metal layer and becomes well anchored to the metal. The transferable layer will transfer because it has a strong physico-chemical affinity for the metal. The peelable skin must also be such that it will anchor strongly to the metal layer and, therefore, contains polar groups which will "bond" to the metal. Carboxylic acid groups are preferred and copolymers of ethylene and acrylic acid and methacrylic acid have been found to be particularly suitable.

For successful operation of the present invention the peelable coating must be readily transferable and this depends upon proper selection of the following properties: chemical composition; visco-elasticity; redox potential; pH; thickness; degree of contact between the coating and the aluminum layer; anti-block; reel tension; the energy of the bonds between peeled coating and aluminum; and the level of oxygen in the metallizer.

When the transfer of the protective coating onto the metal layer takes place during reeling in the metallizer, which is substantially oxygen free, the invention has the added advantage that the aluminum layer is protected from scratches during processing because the metal is protected before it leaves the metallizer by the transfer of the protective layer onto the aluminum layer. Furthermore, since the metallizer itself is substantially oxygen free, the exposure of the metal layer to oxygen is reduced and hence the likelihood of oxidation of the metal layer is reduced. Barrier properties are improved compared to standard metallized films, perhaps because of the increased purity of the metal film. The presence of the protective layer on the metal layer also improves the resistance of the metal layer under humid conditions by providing physical and chemical protection. In addition, by appropriate choice of materials, the film can be printable and/or sealable on either or both sides, and can, therefore, be used as such on packaging machines, without the need for additional work by the converters. The transfer coating process of the present invention can also avoid the need for adhesive layers between the layers of multi-layer metallized films.

In standard metallized film based on aluminum, the aluminum layer tends to oxidize. In the present invention, however, when the reel of the metallized film leaves the metallizer, the aluminum layer is already protected by the coating (Ctg2) so that the oxidation is less because the film is covered by a coating inside the metallizer. This reduced oxidation provides better barrier properties for the same deposit of aluminum per square meter, better resistance to humidity and better resistance to chemicals.

The process of the present invention may be used to produce films which can replace current, unprinted laminated films, such as the 20-micron bi-axially oriented polypropylene film/metal layer/adhesive layer/20-micron bi-axially oriented polypropylene film currently used commercially. These films are currently produced by adhesive lamination of two, 20-micron bi-axially oriented polypropylene films, one of which is metallized.

FIG. 8 illustrates a current laminated film consisting of a 20-micron layer of polypropylene film laminated to a metallized 20-micron layer of polypropylene film. FIG. 9 illustrates a comparable film produced by the process of the present invention. Comparison of the films of these two Figures shows that the invention removes the need for an adhesive layer. The advantages of the structure made according to the present invention include the presence of Ctg2 on one side, which results in a low minimum sealing temperature. We have also found that the packaging weight can be decreased by as much as 25% for the 30 g/m² structure because of the ability to use a thinner monofilm rather than a relatively thicker laminate, and including the ability to avoid the use of adhesives.

A typical process for producing the film that is currently used requires the production of two webs: the first web is extruded, stretched, and wound up as a roll (step 1), slit to fit into the metallizer (step 2), metallized (step 3), and then slit again to eliminate the edges that are typically not of acceptable quality (step 4). The second web is also extruded, stretched, and wound up as a roll (step 5), and then slit to the same width as web 1 (step 6). The two webs are then adhesive or extrusion laminated (step 7) and the laminate is then slit (step 8). When using the process of the present invention, only the following steps are required: a web is extruded, stretched, and wound up as a roll (step 1), coated both faces (step 2), slit after coating (step 3), metallized (step 4) and then slit (step 5).

Accordingly, only 5 steps are needed to get the final product. The process of the present invention, therefore, can decrease the number of production steps from 8 to 5.

The metallized film made, according to the present invention, can be used as a base material for pressure-sensitive laminates such as may be used in labelling applications. In addition, films made by the new transfer process will have fewer scratches because the metal is protected before it leaves the metallizer without the need for subsequent lamination or coating a protective layer onto the metal layer. The film will have an improved appearance since only the defects of the coating are visible, unlike with standard films where the defects of two coatings and of the film are visible. In addition, there is a reduced risk of metal scratching at the label manufacturer because there will be no direct contact between metal and adhesives. Furthermore, in current systems which employ the acrylic polymer based adhesives (especially the water-based ones) the acrylic can dissolve the aluminum layer and the dissolution of aluminum ions into the adhesive can cross-link the adhesive and decrease the properties of the pressure-sensitive adhesive. This is avoided when using films produced according to the present invention in which the metal layer is protected.

The films produced according to the present invention may also have some improved utility, e.g., as insulators and in construction, for covering windows where they could provide some protection against the sun. The invention also allows the production of a bi-axially oriented polypropylene film with a metallized layer covered by an ionomer, the ionomer being made by the reaction between the aluminum layer and the coater layer in the absence of oxygen, and then reintroduced at atmospheric pressure. The coated layer may, for example, be an ethylene/acrylic acid copolymer.

The invention is illustrated by the following Examples.

In these examples the following test methods were used;

The adhesion between layers was measured using a Friction Peel Tester Model 225-1 made by Thwing Albert Instrument Company, Philadelphia, USA by applying 25 mm wide adhesive tape to the surface of the film and measuring the average force in Newtons required to remove 10 centimeters of the tape with the coating from the film when pulled back at 300 mm/min. the angle between the tape and the film being comprised between 170° and 180°.

The optical density of the film was measured on a Gretag Macbeth D200-II machine by shining a beam from a halogen lamp perpendicularly onto the film and measuring the amount of light transmitted.

The permeability of the film to oxygen was measured in $cm^3/m^2/day$ according to ASTM D3985 at 23° C. and 0% relative humidity using an Oxtran 2/20 device made by Mocon 7500 Boone Avenue North, Minneapolis Minn. 55428 USA.

The permeability of the film to water vapour (WVTR) was measured in $g/m^2$ per 24 hours according to DIN 53380 at 23° C. and 75% relative humidity using a Permatran W 3/31 device also supplied by Mocon.

EXAMPLE

A film was produced which consisted of a cavitated 35-micron oriented polypropylene film provided on one side with a co-extruded skin of a propylene, ethylene butene terpolymer and on the other side with a skin layer of polypropylene grafted with maleic anhydride and a layer of an ethylene vinyl alcohol copolymer. The film was corona-treated on the co-extruded skin and coated on the same side with about 1.5 g/m² (dried) of the previously described Ctg2.

The film was fed to a standard metallizer (as illustrated in FIG. 2) where metal was deposited on the ethylene vinyl alcohol copolymer under the following conditions.

The metallizer was first evacuated for a period of 11 minutes, the temperature of the process reel (7) was set at −20° C. to −30° C. The web was then unwound at 346 meters per minute; the traction in the unwind was 300 Newtons/m and the traction in the winder was 45 Newtons/m. Aluminum wire was supplied to the crucible in the metallization chamber at a rate of 51 cm/minute, the pressure in the metallization chamber was between 4 and $7 \times 10^{-4}$ mbar and the pressure in the winding and unwinding chamber was $9 \times 10^{-2}$ mbar. An aluminum layer of thickness between 30 and 40 nanometers was deposited onto the film. The reel was taken out of the metallizer and heated with infrared heating just before unwinding.

The heating was from a constant infrared emitter that was placed at a 40 cm distance from the reel, and samples were taken at different speeds of unwinding in order to evaluate the influence of the thermal treatment on the barrier properties of the film. It was not possible to measure the temperature of the reel although it is believed that the maximum temperature could have been between 70° C. and 110° C.

After unwinding of the reel of metallized film produced in this manner, substantially 100% of the low temperature sealing composition (Ctg2) was found to have transferred to the metal layer.

The properties of the metallized film were determined at different unwinding speeds. The speed indicated is the unwinding speed of the slitter, the higher the speed the lower the heating of the reel.

| Speed m/min | WVTR g/m² per 24 hours | Oxygen Transmission cm³/m² per 24 hours | Resistivity Ohms |
|---|---|---|---|
| — | 3.76 | >2000 | 1.53 |
| 30 | 2.05 | 13 | 1.05 |
| 50 | 0.28 | 1.3 | 0.89 |
| 75 | 0.20 | 0.65 | 1.02 |

The films had a metal optical density of 2.5 to 3.0.

Resistivity is measured using a conductivity measuring apparatus type MTM 02 supplied by Hilberg of Alt Wachen Guchen 23, D 63477 Maintal, Germany.

The results indicate that at higher unwinding speeds and, therefore, lower temperature the barrier properties are improved.

The printability of the 35-micron thick cavitated film prepared according to the previous Example was evaluated as follows. The film was corona-treated on the skin layer and in-line printed by gravure. The ink used was type S 8808 from Coates Lorilleux France, the ink type is S 8808, and around 0.8 g/m² of ink (weight after drying) was applied by gravure on 100% of the terpolymer surface of the film. The ink was dried at 50° C. in a thermal oven.

The film had the following structure:
Printed ink layer/corona treatment/skin layer based on terpolymer of polypropylene-ethylene-butylene/homopolymer layer/oriented layer of polypropylene cavitated about 30 microns thick/layer of polypropylene grafted with maleic anhydride/layer of EVOH extruded and oriented/aluminum deposited under vacuum/low temperature sealing layer that was transferred onto metal from the other side of the film. The anchorage of the ink on the corona-treated terpolymer was measured by applying a cellulose lithographic red 1129 from the company Scapa, the tape was removed at an angle of about 90° C. and no ink was removed by the tape showing good anchorage.

The sealability of the film was also evaluated. The evaluation was as follows. A reel of the printed film is put on a horizontal form fill and seal (HFFS) machine, type Record Super Jaguar. The machine direction jaws is transversal+Fin seal. Pack length 200 mm. The ink-to-ink coefficients of friction are 0.30 static and 0.23 dynamic. The coefficient of friction of the low temperature sealing layer is 0.50 static and 0.45 dynamic. Measured by slip peel tester TEC 450.

The film has good machinability, no noise and no scratches when processed on the machine. The sealing range of the film of the invention, after transfer of the low temperature sealing layer onto the metal layer is similar to the sealing temperature range of a standard film when sealed under the same conditions. The sealing temperature range of a 35-micron thick film of the invention was compared with the sealing temperature range of a commercial 30-micron thick film (30 MW 648) and with the sealing temperature range of a commercial 40 micron thick film (40 MW 648). Both commercial films were coated with the same low temperature sealable coating and are supplied by ExxonMobil Chemicals Films Europe. The films were sealed in a Record Super Jaguar sealing machine with two pairs of jaws to form a 20-cm pack length. The film speed was 50 meters per minute and the minimum sealing temperature to obtain a seal strength of at least 300 g/25 mm was measured. A jaw temperature of 112° C. was required for the 30 MW 648 film, a jaw temperature of 143° C. was required for the film of the invention and a jaw temperature of 157° C. was required for the 40 MW 648 film. This shows that the 35-micron film of the invention has sealing properties between the commercial 30 and 40-micron films having the same sealable coating and thus shows that the sealing properties of the coating are retained after it is transferred according to the invention.

The invention claimed is:

1. A process for the production of a multi-layer film comprising the steps of:
   i) providing a preliminary film structure comprising a first layer and a transfer layer, each layer having a first side and a second side, the transfer layer detachably attached on the second side of the first layer;
   ii) thereafter providing a metal layer having a first side and a second side and fixedly attaching the second side of the metal layer on the first side of the first layer to form an intermediate film structure;
   iii) contacting the first side of the metal layer with the second side of the transfer layer to bond the first side of the metal layer with the second side of the transfer layer; and
   iv) thereafter detaching the first side of the transfer layer from the second side of the first layer and transferring the transfer layer from the second side of the first layer to the first side of the metal layer.

2. The process according to claim 1, wherein the step of contacting further comprises:
   winding the intermediate film structure into a roll and detaching comprises unwinding the produced multi-layer film from the roll, to transfer the transfer layer from the second side of the first layer to the first side of the metal layer.

3. The process according to claim 1 in which the first layer and the transfer layer are extruded polymer layers.

4. The process according to claim 1 in which at least one of the first layer and the transfer layer comprise multiple layers.

5. The process according to claim 1 in which the metal layer is an aluminum layer.

6. The process according to claim 1 in which the transfer layer comprises water-based, solvent-based or solventless lacquers or inks, based on resins.

7. The process according to claim 1 in which the transfer layer comprises a polymer or copolymer containing polar groups.

8. The process according to claim 1 in which the transfer layer is detachably attached to the first layer by one of co-extrusion, lamination extrusion-coating, or fluid coating.

9. The process according to claim 1 in which the transfer layer is printable and/or sealable.

10. The process according to claim 1 in which the transfer layer is transferred within a metallizer in which the metal layer is fixedly attached on the first side of the first layer.

11. The process according to claim 1 further comprising providing a skin layer on the second side of the first layer.

12. The process according to claim 1 in which the transfer layer is a heat sealable layer, a barrier layer and/or a printable layer.

13. The process according to claim 1 further comprising the steps of:
providing an additional layer in the preliminary film structure between the first layer and the transfer layer, the additional layer fixedly engaged with the first layer and the transfer layer detachably engaged with the additional layer.

14. The process according to claim 13 in which the additional layer comprises a second heat sealable layer, a barrier layer and/or a second printable layer.

15. The process according to claim 13 in which the additional layer comprises a polyolefin of melting point from 5° C. to 50° C. lower than the melting point of the polymer of the first layer.

16. The process according to claim 1 in which the transfer layer comprises a copolymer of ethylene and an unsaturated acid or unsaturated ester.

17. The process according to claim 1 further comprising the step of treating a surface of the multilayer film by at least one of corona flame, plasma, oxidation, chlorination, or heat treatment.

18. The process according to claim 1 further comprising the step of applying a primer to at least one of
i) a surface engaged with the metal layer, and
ii) a surface of the metal layer.

19. The process according to claim 1 further comprising the step of packaging an article with the multi-layer film.

20. The process according to claim 1 further comprising the step of labeling an article with the multi-layer film.

21. The process of claim 1, wherein the transfer layer comprises a polymer containing polar groups.

22. The process of claim 1, wherein the transfer layer comprises a copolymer selected from the group of (a) a copolymer of ethylene and unsaturated esters, (b) a copolymer of ethylene and unsaturated alcohols, and (c) a copolymer of ethylene and acrylic acid or methacrylic acid.

23. The process of claim 1, wherein the transfer layer comprises a water-based, solvent-based or solventless thermoplastic lacquer.

24. The process of claim 1, wherein the transfer layer comprises inks based on resins.

25. A process for the production of a multi-layer film comprising the steps of:
i) providing a preliminary film structure comprising a first layer, a second layer and a transfer layer, each layer having a first side and a second side, the transfer layer detachably attached on the second side of the first layer and the second layer attached on the first side of the first layer;
ii) thereafter providing a metal layer having a first side and a second side and fixedly attaching the second side of the metal layer on the first side of the second layer to form an intermediate film structure;
iii) contacting the first side of the metal layer with the second side of the transfer layer to bond the first side of the metal layer with the second side of the transfer layer; and
iv) thereafter detaching the first side of the transfer layer from the second side of the first layer and transferring the transfer layer from the second side of the first layer to the first side of the metal layer.

26. The process according to claim 25, further comprising the step of printing the first side of the transfer layer.

27. The process according to claim 26, further comprising the step of printing the second side of the transfer layer.

28. The process according to claim 25, further comprising the step of treating the first side of the transfer layer.

29. The process according to claim 25, further comprising the step of treating the second side of the transfer layer.

30. The process according to claim 25 further comprising the step of packaging an article with the multilayer film.

31. The process according to claim 25, further comprising the step of labeling an article with the multilayer film.

* * * * *